(12) United States Patent
Gmeinwieser

(10) Patent No.: US 10,727,382 B2
(45) Date of Patent: Jul. 28, 2020

(54) METHOD OF FORMING ONE OR MORE THREE-DIMENSIONAL OBJECTS

(71) Applicant: OSRAM OLED GmbH, Regensburg (DE)

(72) Inventor: Nikolaus Gmeinwieser, Donaustauf (DE)

(73) Assignee: OSRAM OLED GmbH, Regensburg (DE)

(*) Notice: Subject to any disclaimer, the term of this patent is extended or adjusted under 35 U.S.C. 154(b) by 43 days.

(21) Appl. No.: 15/760,844

(22) PCT Filed: Sep. 16, 2016

(86) PCT No.: PCT/EP2016/071949
§ 371 (c)(1),
(2) Date: Mar. 16, 2018

(87) PCT Pub. No.: WO2017/046316
PCT Pub. Date: Mar. 23, 2017

(65) Prior Publication Data
US 2019/0267522 A1    Aug. 29, 2019

(30) Foreign Application Priority Data
Sep. 18, 2015 (DE) .................... 10 2015 115 796

(51) Int. Cl.
*H01L 33/58* (2010.01)
*B33Y 10/00* (2015.01)
(Continued)

(52) U.S. Cl.
CPC ............ *H01L 33/58* (2013.01); *B29C 64/124* (2017.08); *B29C 64/135* (2017.08); *B33Y 10/00* (2014.12);
(Continued)

(58) Field of Classification Search
CPC ............................ B29C 64/124; B29C 64/135
See application file for complete search history.

(56) References Cited

U.S. PATENT DOCUMENTS 9,099,575 B2    8/2015  Medendorp, Jr. et al.
2014/0147654 A1  5/2014  Walther et al.
(Continued)

FOREIGN PATENT DOCUMENTS

DE    10 2012 212 320 A1    1/2014
DE    10 2015 105 509 A1    10/2016
(Continued)

OTHER PUBLICATIONS

Tumbleston, J. R. et al., "Continuous liquid interface production of 3D objects", Science, 2015, vol. 347, Issue 6228, pp. 1349-1352.

*Primary Examiner* — Ermias T Woldegeorgis
(74) *Attorney, Agent, or Firm* — DLA Piper LLP (US)

(57) ABSTRACT

A method of forming one or more three-dimensional objects for an optoelectronic lighting device including a carrier with an optoelectronic semiconductor component includes providing a carrier of an optoelectronic lighting device, wherein an optoelectronic semiconductor component is arranged on the carrier, and a construction region partly delimited by the carrier is defined, the optoelectronic semiconductor component facing the construction region, introducing a polymerizable liquid into the construction region, and exposing the construction region to form one or more solid polymers from the polymerizable liquid in a curing zone included by the construction region, and one or more three-dimensional objects from the one or more solid polymers in the curing zone, wherein an ineffective region is formed during the process of exposing the construction region, polymerization being inhibited in the ineffective region, and the curing zone is arranged between the carrier and the ineffective region.

17 Claims, 3 Drawing Sheets

(51) Int. Cl.
  *B33Y 80/00* (2015.01)
  *B29C 64/135* (2017.01)
  *H01L 33/48* (2010.01)
  *B29C 64/124* (2017.01)
  *B29L 31/34* (2006.01)

(52) U.S. Cl.
  CPC ............ *B33Y 80/00* (2014.12); *H01L 33/483* (2013.01); *B29L 2031/3406* (2013.01); *H01L 2933/0033* (2013.01); *H01L 2933/0058* (2013.01)

(56) References Cited

U.S. PATENT DOCUMENTS

2015/0102532 A1\* 4/2015 DeSimone ............ G03F 7/0037
  264/401
2015/0221835 A1 8/2015 Tischler et al.

FOREIGN PATENT DOCUMENTS

| | | | |
|---|---|---|---|
| JP | 2012-162025 A | 8/2012 | |
| WO | 2012/163946 A1 | 12/2012 | |
| WO | 2014/126837 A2 | 8/2014 | |
| WO | 2015/092014 A1 | 6/2015 | |
| WO | WO-2015092014 A1 \* | 6/2015 | ........... G02B 6/0065 |

\* cited by examiner

METHOD OF FORMING ONE OR MORE THREE-DIMENSIONAL OBJECTS

TECHNICAL FIELD

This disclosure relates to a method of forming one or more three-dimensional objects and an optoelectronic lighting device.

BACKGROUND

John R. Tumbleston et al., Science, VOL 347, ISSUE 6228, pages 1349 to 1352, Mar. 20, 2015, entitled "Continuous liquid interface production of 3D objects", discloses a three-dimensional photolithographic printing method in which a three-dimensional object is formed by a UV-curing plastic by UV exposure.

WO 2014/126837 A2 discloses a method of forming a three-dimensional object, wherein, analogously to Tumbleston, a UV-curing plastic is exposed by UV light to form a three-dimensional object.

There is nonetheless a need to provide an efficient way to form one or more three-dimensional objects for an optoelectronic lighting device comprising a carrier with an optoelectronic semiconductor component.

SUMMARY

I provide a method of forming one or more three-dimensional objects for an optoelectronic lighting device including a carrier with an optoelectronic semiconductor component, including providing a carrier of an optoelectronic lighting device, wherein an optoelectronic semiconductor component is arranged on the carrier, and a construction region partly delimited by the carrier is defined, the optoelectronic semiconductor component facing the construction region, introducing a polymerizable liquid into the construction region, and exposing the construction region to form one or more solid polymers from the polymerizable liquid in a curing zone included in the construction region, and one or more three-dimensional objects from the one or more solid polymers in the curing zone, wherein an ineffective region is formed during the process of exposing the construction region, polymerization being inhibited in the ineffective region, and the curing zone is arranged between the carrier and the ineffective region.

I also provide an optoelectronic lighting device including a carrier on which an optoelectronic semiconductor component is arranged, and one or more three-dimensional objects each formed by the method including providing a carrier of an optoelectronic lighting device, wherein an optoelectronic semiconductor component is arranged on the carrier, and a construction region partly delimited by the carrier is defined, the optoelectronic semiconductor component facing the construction region, introducing a polymerizable liquid into the construction region, and exposing the construction region to form one or more solid polymers from the polymerizable liquid in a curing zone included in the construction region, and one or more three-dimensional objects from the one or more solid polymers in the curing zone, wherein an ineffective region is formed during the process of exposing the construction region, polymerization being inhibited in the ineffective region, and the curing zone is arranged between the carrier and the ineffective region.

LIST OF REFERENCE SIGNS

Figure 1:
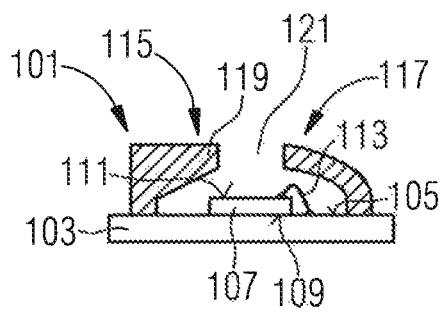
FIG. 1 shows a first optoelectronic lighting device.

101 first optoelectronic lighting device
103 carrier
105 top side of the carrier
107 optoelectronic semiconductor component
109 underside of the optoelectronic semiconductor component
111 top side of the optoelectronic semiconductor component
113 bond wire
115, 117 housing side walls
119 section of the housing side wall 115
121 gap
201 second optoelectronic lighting device
203 optical waveguide
205 rectilinear section of the optical waveguide
207 freeform section of the optical waveguide
209 conically tapering section of the optical waveguide
211 optical waveguide branching junction of the optical waveguide
301 third optoelectronic lighting device
303 lens
305 light beam
307 focal point
401 fourth optoelectronic lighting device
403 housing
405 electrical line
407 freeform lens
409 top side of the housing 403
501 fifth optoelectronic lighting device
503 anchoring structure
505, 507 component sections
509 depression
511 tips
513 three-dimensional object
601 sixth optoelectronic lighting device
603 three-dimensional object
701 seventh optoelectronic lighting device
703 dam
705 potting material
707 three-dimensionally formed object
801 eighth optoelectronic device
803 optically transparent element
805 construction surface
807 construction region
809 ineffective region
811 feeding a polymerization inhibitor
813 exposure light
815 three-dimensionally formed object
817 curing zone
819 forward movement
901 providing
903 filling
905 exposing 907 continuously maintaining
1001 providing
1003 introducing
1005 exposing
1007 forming an ineffective region

DETAILED DESCRIPTION

My method of forming one or more three-dimensional objects for an optoelectronic lighting device comprising a carrier with an optoelectronic semiconductor component may comprise the following steps:
providing a carrier of an optoelectronic lighting device, wherein an optoelectronic semiconductor component is arranged on the carrier, wherein a construction region that is partly delimited by the carrier is defined, the optoelectronic semiconductor component facing the construction region,
introducing a polymerizable liquid into the construction region,
exposing the construction region to form one or more solid polymers from the polymerizable liquid in a curing zone comprised by the construction region, to form one or more three-dimensional objects from the one or more solid polymers in the curing zone,
wherein an ineffective region is formed during the process of exposing the construction region, polymerization being inhibited in the ineffective region, wherein the curing zone is arranged between the carrier and the ineffective region.

My optoelectronic lighting device may comprise:
a carrier on which an optoelectronic semiconductor component is arranged, and
one or more three-dimensional objects formed in each case by the method of forming one or more three-dimensional objects.

I thus provide the concept, in particular and inter alia, of forming one or more three-dimensional objects for an optoelectronic lighting device by a so-called 3D printing method. This affords the technical advantage, in particular, that the one or more three-dimensional objects for the optoelectronic lighting device may be produced efficiently. In general, a multiplicity of possible shapes and geometries for the one or more three-dimensional objects are possible by a 3D printing method. Optoelectronic lighting devices comprising completely differently and individually manufactured three-dimensional objects may thus be produced in an efficient manner. In particular, shapes of objects generally not possible in an injection molding process or simply by assembling a plurality of individual parts are advantageously possible by the 3D printing method.

Furthermore, the 3D printing method advantageously affords a high flexibility, in particular, which allows efficient production even of small batches or products comprising many variants. This is because, in an injection molding process, a dedicated injection mold need not be produced for each component to be manufactured. This is generally complex, and so this is generally worthwhile only in large batches.

On account of the special characteristic of the three-dimensional printing method, the one or more solid polymers is or are formed directly on the carrier and/or respectively on the semiconductor component. Consequently, after curing of the polymerizable liquid, the three-dimensional objects are thus already efficiently connected to the carrier and/or respectively the semiconductor component such that the adhesive bonding steps that are otherwise customary may be dispensed with.

The fact that an ineffective region is formed during exposure affords the technical advantage, in particular, that polymerizable liquid may continue flowing through the space created by the ineffective region without curing of the polymerizable liquid occurring in the ineffective region. This advantageously enables the one or more three-dimensional objects to be formed particularly rapidly.

Inhibiting encompasses, in particular, retarding, curbing or preventing the polymerization. That is to say, therefore, that in the ineffective region the polymerizable liquid polymerizes only in a retarded fashion or that polymerization has been or is curbed or prevented.

In this respect, the ineffective region may be referred to, in particular, as an inhibited zone.

The curing zone denotes a zone within the construction region in which the liquid polymerizes, that is to say cures, on account of exposure.

The following steps may furthermore be provided:
providing an optically transparent element comprising a construction surface, wherein the optoelectronic semiconductor component faces the construction surface, wherein the construction region is defined by the carrier and the construction surface as the region lying between the carrier and the construction surface,
filling the construction region with the polymerizable liquid,
exposing the construction region through the optically transparent element with simultaneous forward movement of the carrier away from the construction surface to form one or more solid polymers from the polymerizable liquid in the curing zone, and form one or more three-dimensional objects from the one or more solid polymers in the curing zone, with the following step simultaneously being performed:
continuously maintaining a contact between the ineffective region of the polymerizable liquid and the construction surface.

Introducing a polymerizable liquid into the construction region may thus comprise filling the construction region with the polymerizable liquid.

The fact that during exposure and during simultaneous forward movement of the carrier away from the construction surface a contact between the ineffective region of the polymerizable liquid, polymerization being inhibited in the ineffective region, and the construction surface is continuously maintained affords the technical advantage, in particular, that in the course of the forward movement of the carrier away from the construction surface polymerizable liquid may continue flowing into the space created on account of the forward movement, without curing of the polymerizable liquid occurring in the ineffective region. That is to say, therefore, that curing is inhibited directly at the construction surface such that the polymerizable liquid may continue flowing when the carrier moves away from the construction surface. This advantageously enables the one or more three-dimensional objects to be formed particularly rapidly.

If such an ineffective region were not provided, the liquid would cure directly at the construction surface on account of the exposure such that it is no longer possible for liquid to continue flowing when the carrier is moved forward.

The one or more three-dimensional objects may each be an element selected from the following group of three-dimensional objects: housing wall for a housing for the semiconductor component, optical waveguide for guiding light emitted by the semiconductor component away from the semiconductor component, lens that optically images light emitted by the semiconductor component.

Providing a housing wall for a housing for the semiconductor component comprises the technical advantage, in particular, that the semiconductor component may be efficiently protected against external influences. The fact that the housing wall is or has been formed by my method affords the technical advantage, in particular, that the housing wall may be produced efficiently and rapidly and in different variations.

Providing an optical waveguide comprises the technical advantage, in particular, that the light emitted by the semiconductor component during operation thereof may be efficiently guided away from the semiconductor component. The fact that the optical waveguide has been or is produced by my method affords the technical advantage, in particular, that arbitrary shapes are possible for the optical waveguide.

Providing the lens comprises the technical advantage, in particular, that the light emitted by the semiconductor component during the operation thereof may be efficiently imaged. The fact that the lens has been or is formed by my method affords the technical advantage, in particular, that arbitrary lens shapes are possible. In this regard, for example, a specific image characteristic of the lens may be set in an advantageous manner. For example, a focal point of the lens may thus be set in an efficient manner.

I provide that, in a housing wall, the latter may be formed such that the housing wall projects beyond a semiconductor component surface of the semiconductor component facing away from the carrier to at least partly shield the semiconductor component surface from electromagnetic radiation.

This affords the technical advantage, in particular, that the semiconductor component may be at least partly shielded against electromagnetic radiation in an efficient manner. This is advantageous, for example, if the semiconductor component is configured as a photodiode such that the photodiode may then be efficiently shielded against stray light in an advantageous manner on account of the shielding. If a light emitting diode is also additionally situated on the carrier, which diode emits light during its operation, this light might lead to corruption of a measurement of the photodiode. The shielding by the correspondingly configured housing wall advantageously has the effect, however, that the light from the light emitting diode does not reach the photodiode.

The housing wall may comprise an undercut.

The housing wall may be formed with an undercut.

Providing an undercut comprises the technical advantage, in particular, to enable the semiconductor component to be efficiently shielded against stray light.

A three-dimensional object may be a hollow body comprising an opening, wherein the semiconductor component is accommodated in the hollow body.

This affords the technical advantage, in particular, that the semiconductor component may be efficiently protected against external influences. In particular, efficient shielding against stray light is brought about as a result.

The optoelectronic semiconductor component may be configured as a photodiode.

The optoelectronic semiconductor component may be configured as a light emitting diode.

The optoelectronic semiconductor component may be configured as a laser diode.

The semiconductor component may be configured as a semiconductor chip, in particular as a light emitting diode chip or as a laser diode chip.

A plurality of optoelectronic semiconductor components may be arranged on the carrier. The semiconductor components may be configured identically or differently.

An optical waveguide may be formed on a light emitting surface of the semiconductor component.

This affords the technical advantage, in particular, that the optical waveguide is arranged directly on the light emitting surface such that the optical waveguide may guide the emitted light away from the semiconductor component in a particularly efficient manner. In particular, an optical waveguide configured in this way need not also additionally be adhesively bonded to the light emitting surface. Furthermore, efficient production, in particular, is brought about as a result.

A lens may be formed on a light emitting surface of the semiconductor component.

This affords the technical advantage, in particular, that the emitted light may be efficiently imaged by the lens. In particular, a lens configured in this way need no longer be adhesively bonded to the light emitting surface in a complex fashion.

In a plurality of semiconductor components arranged on the carrier, a dedicated lens or a dedicated optical waveguide may be arranged in each case on the semiconductor components. In particular, the respective image characteristic of the lenses is such that the latter image the light emitted by the respective semiconductor component at a common focal point.

An anchoring structure may anchor the one or more solid polymers on the carrier.

This affords the technical advantage, in particular, that the one or more solid polymers may be efficiently anchored on the carrier. This therefore advantageously enables the one or more solid polymers to be efficiently secured to the carrier. As a result, therefore, a correspondingly configured optoelectronic lighting device may be used even in harsh ambient conditions. Such harsh ambient conditions encompass vibrations, for example.

The anchoring structure may be formed at least partly integrally with the carrier, and/or wherein the anchoring structure is formed at least partly as a component which is physically separate from the carrier and is arranged thereon.

The fact that the anchoring structure is formed at least partly integrally with the carrier, for example, affords the technical advantage, in particular, that the carrier functions efficiently as an anchoring for the one or more solid polymers. That is to say, therefore, that the carrier, in addition to its function carrying the semiconductor components or the semiconductor component, also comprises a further function: an anchoring function.

The fact that the anchoring structure is formed, for example, at least partly as a component which is physically separate from the carrier and arranged thereon affords the technical advantage, in particular, that the anchoring structure may be formed independently of the carrier. That is to say that, in particular during the process of forming the component of the anchoring structure, special characteristics of the carrier have to be taken into consideration to a lesser extent than if the anchoring structure is formed integrally with the carrier. This is because there may be cases, for example, in which the carrier is not permitted to comprise an anchoring structure on account of particular requirements or specifications. Nevertheless, an anchoring of the one or more solid polymers is made possible in an efficient manner even in this case, by virtue of a separate component being provided for this purpose, the separate component performing this anchoring function.

The anchoring structure may comprise a three-dimensional structure, which may also be referred to as a relief. By way of example, a surface of the carrier comprises a three-dimensional structure. That is to say that the surface is not planar or flat, but rather comprises elevations and depressions, for example. That is to say that generally, the three-dimensional structure may comprise elevations and/or depressions and/or holes. This analogously applies to the separate component that may comprise such a three-dimensional structure, preferably comprising elevations and/or depressions and/or holes.

An adhesion promoter layer may enable the one or more solid polymers to adhere to the carrier.

This affords the technical advantage, in particular, of enabling the one or more solid polymers to adhere to the carrier in an efficient manner. That is to say that the adhesion promoter layer enables the one or more solid polymers to be efficiently secured to the carrier. As a result, in an advantageous manner, an optoelectronic lighting device is thus provided which may be used even in harsh ambient conditions, comprising vibrations, for example. The adhesion promoter layer is comprised by the anchoring structure, for example.

After the process of introducing the polymerizable liquid into the construction region and before and/or during the process of exposing by the semiconductor component, ultraviolet light may be emitted to polymerize the polymerizable liquid.

This affords the technical advantage, in particular, that the liquid may be efficiently polymerized in a region around the semiconductor component. That is to say, therefore, that a region in which the liquid cures on account of the UV exposure is thereby provided directly around the semiconductor component. This comprises the technical advantage, in particular, that efficient securing or adhesion or anchoring of the solid polymer to the carrier and/or respectively to the semiconductor component is made possible via this cured region.

The carrier may comprise a coating configured to absorb at least 50% of a wavelength of the exposure light.

This affords the technical advantage, in particular, that, on account of reflections of the exposure light at the carrier, a falsification of the three-dimensional shape of the three-dimensional object may be avoided.

The exposure light here denotes the light impinging on the construction region through the optically transparent element.

Exposure may be effected by UV light. That is to say that the exposure light is UV light. UV light denotes electromagnetic radiation in a wavelength range of 1 nm to 400 nm.

The carrier may comprise a ceramic or respectively is a ceramic carrier.

The carrier may be a circuit board. A circuit board is referred to as "Printed Circuit Board (PCB)". The circuit board may also be referred to as a printed circuit card or board or as a printed circuit. A circuit board comprises, in particular, an electrically insulating material comprising conductive connections (conductor tracks) adhering thereto.

The carrier may be configured as a metal-core printed circuit board.

A convertor that converts light emitted by the semiconductor component during the operation thereof may be arranged on the semiconductor component. The convertor is thus configured to convert light emitted by the semiconductor component during the operation thereof.

Converting means, in particular, that the emitted light comprising a first wavelength or respectively comprising a first wavelength range is converted into converted light comprising a second wavelength or respectively comprising a second wavelength range. The first wavelength is different from the second wavelength. The first wavelength range and the second wavelength range are at least partly different.

The convertor is configured, for example, as a convertor lamina.

The convertor is configured, for example, as a convertor layer applied on the semiconductor component by a coating method. Such a coating method comprises, for example, electrophoresis and/or so-called "spray coating".

The convertor comprises one or more phosphors, for example.

The semiconductor component may be potted by a potting compound. That is to say that the semiconductor component is embedded at least partly, in particular completely, in a potting compound. In such an instance, then, provision is thus made, for example, for the solid polymer(s) to be formed on the potting compound.

The polymerizable liquid may comprise or respectively is a silicone.

The polymerizable liquid may comprise or respectively is one or more ormocers.

The polymerizable liquid may comprise or respectively is an epoxy.

The optically transparent element may comprise a semipermeable element.

Through the semipermeable element, a polymerization inhibitor may advantageously pass to the construction surface.

Continuously maintaining an ineffective region may be implemented by a polymerization inhibitor being guided through the optically transparent element, wherein an inhibitor gradient is generated in the ineffective region. That is to say that a polymerization inhibitor concentration decreases with increasing distance from the construction surface. This has the effect that a degree of polymerization increases with increasing distance from the construction surface. A polymerization gradient is thus formed as a result. A polymerization region thus comprises a gradient.

The optically transparent element as a semipermeable element may comprise a semipermeable fluoropolymer, a rigid, gas-permeable polymer, porous glass or a combination thereof.

This affords the technical advantage, in particular, that a polymerization inhibitor that maintains the ineffective region may be efficiently guided through the optically transparent element.

The polymerization inhibitor may be oxygen or respectively the polymerization inhibitor comprises oxygen.

The exposure step may be carried out by a maskless photolithography method.

The exposure step may be performed with a two-dimensional exposure structure projected onto or into the construction surface, wherein the structure changes over time, wherein the simultaneous step of forward movement is continued long enough for the three-dimensional object(s) to be formed.

By way of example, the two-dimensional exposure structure is projected by an image projection device. Such an image projection device may also be referred to as a video projector.

The following step additionally may be performed during the forward movement and during exposure: continuously maintaining a gradient of a polymerization region between the ineffective region and the one or more solid polymers, wherein in the contact with these components the gradient of the polymerization region comprises the polymerizable liquid in partly cured form.

A protective diode may be arranged on the carrier. The protective diode is enclosed, for example, within a three-dimensional object, in particular a housing wall, preferably a housing side wall. That is to say that a carrier comprising the semiconductor component and the protective diode is provided, wherein forming the object is performed such that the object encloses or surrounds the protective diode. This advantageously achieves the effect that the protective diode may adsorb less light ranging down to no light any longer, as a result of which the protective diode, which usually comprises silicon, may be operated in an efficient manner. The protective diode brings about, for example, protection against electrostatic discharges and/or brings about, for example, protection in respect of overvoltages that may damage the semiconductor component.

The semiconductor component may be configured as a flip-chip. That is to say that an electrical contacting of the semiconductor component may be effected from an underside of the semiconductor component.

The semiconductor component may be electrically contacted by a bond wire.

The semiconductor component may comprise a planar electrical contact pad at its top side for its electrical contacting. The contact pad comprises a photolithographic structure, for example. That is to say, for example, that the contact pad is configured as a photolithographic contact pad.

The optical waveguide may be configured, for example, such that light guiding and/or light coupling-out give(s) an optical impression of an incandescent thread or an incandescent filament.

The optical waveguide may comprise a hollow cylinder.

The optical waveguide may comprise a plurality of optical waveguide branching functions. The optical waveguide thus branches.

A first longitudinal end of the hollow cylinder may be arranged on the semiconductor component and a plurality of optical waveguide branching junctions may be formed at the opposite longitudinal end of the hollow cylinder relative to the first longitudinal end.

The above-described properties, features and advantages and the way in which they are achieved will become clearer and more clearly understood in association with the following description of the examples explained in greater detail in association with the drawings.

Hereinafter, identical reference signs may be used for identical features.

FIG. 1 shows a first optoelectronic lighting device 101 in a lateral sectional view.

The optoelectronic lighting device 101 comprises a carrier 103. An optoelectronic semiconductor component 107 is arranged on a top side 105 of the carrier 103. The optoelectronic semiconductor component 107 is a semiconductor chip, for example. The optoelectronic semiconductor component 107 comprises an underside 109 and a top side 111 situated opposite the underside 109. The semiconductor component 107 is arranged by its underside 109 on the top side 105 of the carrier 103. That is to say that the top side 111 of the semiconductor component 107 faces away from the top side 105 of the carrier 103.

The top side 111 of the semiconductor component 107 electrically connects to the top side 105 of the carrier 103 by a bond wire 113.

To the left and right of the semiconductor component 107 relative to the plane of the drawing, two housing side walls 115, 117 are formed on the top side 105 of the carrier 103. In this case, these two housing side walls 115, 117 have been formed in accordance with my method of forming one or more three-dimensional objects. The two housing side walls 115, 117 thus form housing walls of a housing for the semiconductor component 107.

The two housing side walls 115, 117 may be formed circumferentially around the semiconductor component 107. Even further housing side walls (not shown here) may be provided, which together with the housing side walls 115, 117 form a housing for the semiconductor component 107.

The housing side wall 117 comprises a quarter arc shape and thus covers at least part of the top side 105 of the carrier 103.

The housing side wall 115 comprises a section 119 at least partly projecting above the top side 111 of the semiconductor component 107.

That is to say that both housing side walls 115, 117 comprise an undercut.

That is to say that both housing side walls 115, 117 are configured such that they each comprise a section that acts as a shield, analogously to a roof such that electromagnetic radiation may radiate to the semiconductor component 107 and/or respectively electromagnetic radiation may radiate away from the semiconductor component 107 only through a gap 121 between the two sections of the two housing side walls 115, 117 that bring about the shield.

In an example not shown, the semiconductor component 107 is or respectively has been at least partly, in particular completely, potted. That is to say, therefore, that, for example, a potting compound or a potting material is introduced into the cavity formed by the two housing side walls 115, 117.

The shape of the two housing side walls 115, 117 may be produced in a multiplicity of shapes on account of the specific configuration in accordance with my method such that different shapes may be produced depending on the concrete application. For this purpose, it is not necessary to produce a specific shape and mold each time. Rather, it is sufficient, by an exposure corresponding to the desired shape, to expose the construction region and simultaneously to move the carrier 103 away from the construction surface, while simultaneously maintaining a contact between the ineffective region and the construction surface.

Methods known per se of producing a housing for a semiconductor component comprise a first step of separately producing the housing walls. In a second step, the housing walls are then adhesively bonded onto the carrier in complex adhesive bonding methods such that the adhesively bonded housing walls form a housing for the semiconductor component. In a third step, the semiconductor component is then potted. That is to say that the housed semiconductor component is potted, for example.

By contrast, my method provides for first providing the carrier with the semiconductor component in a first step such that, in a second step, housing walls may be formed directly on the carrier by my method such that complex adhesive bonding steps are obviated. Furthermore, there is a high flexibility with regard to the shapes and geometries of the housing walls.

In an example not shown, a protective diode is arranged on the carrier. The protective diode is enclosed, for example, within one of the housing side walls 115, 117. That is to say that a carrier comprising the semiconductor component and the protective diode are provided, wherein forming the housing side walls is performed such that one of the housing side walls encloses or surrounds the protective diode. This advantageously has the effect that the protective diode may adsorb less light ranging down to no light any longer, as a result of which the protective diode, which usually comprises silicon, may be operated in an efficient manner.

Figure 2:
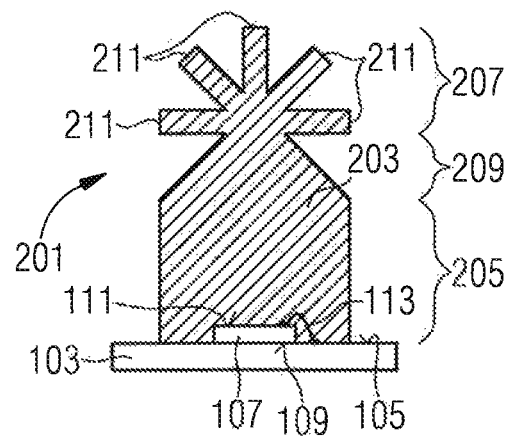
FIG. 2 shows a second optoelectronic lighting device.

FIG. 2 shows a second optoelectronic lighting device 201 in a lateral sectional view.

The optoelectronic lighting device 201, analogously to the first optoelectronic lighting device 101 from FIG. 1, comprises a carrier 103 and an optoelectronic semiconductor component 107. Reference is made to the explanations in this regard to avoid repetitions.

An optical waveguide 203 is formed on the top side 105, wherein the optical waveguide 203 also covers the top side 111 of the semiconductor component 107. That is to say that the optical waveguide 203 is formed or arranged on the top side 111 of the semiconductor component 107.

The optical waveguide 203, too, has been formed by my method of forming one or more three-dimensional objects. The optical waveguide 203 comprises a rectilinear section 205 extending away from the top side 111 of the semiconductor component 107. The rectilinear section 205 comprises a cylindrical or tubular shape. The rectilinear section 205 is followed by a conically tapered or tapering section 209, which is followed by a freeform section 207. The freeform section 207 comprises five optical waveguide branching junctions 211 emanating from the tapering section 209 in a star-shaped fashion.

The optical waveguide 203 thus comprises a shape which conventional optical waveguides generally do not comprise, since this shape generally may not be produced, or may be produced only with high outlay, by known production methods. On account of my method wherein the optical waveguide 203 is produced by exposing a polymerizable liquid, such a freeform shape may be produced in an efficient manner.

Furthermore, since provision is also made for continuously maintaining the contact between the ineffective region of the polymerizable liquid and the construction surface, the optical waveguide 203 (this likewise applies to the two housing side walls 115, 117 of the optoelectronic lighting device 101 from FIG. 1) may be produced particularly rapidly compared to previously known 3D printing methods. This is because maintaining the contact advantageously achieves the effect that polymerizable liquid may continue flowing during the forward movement.

Figure 3:
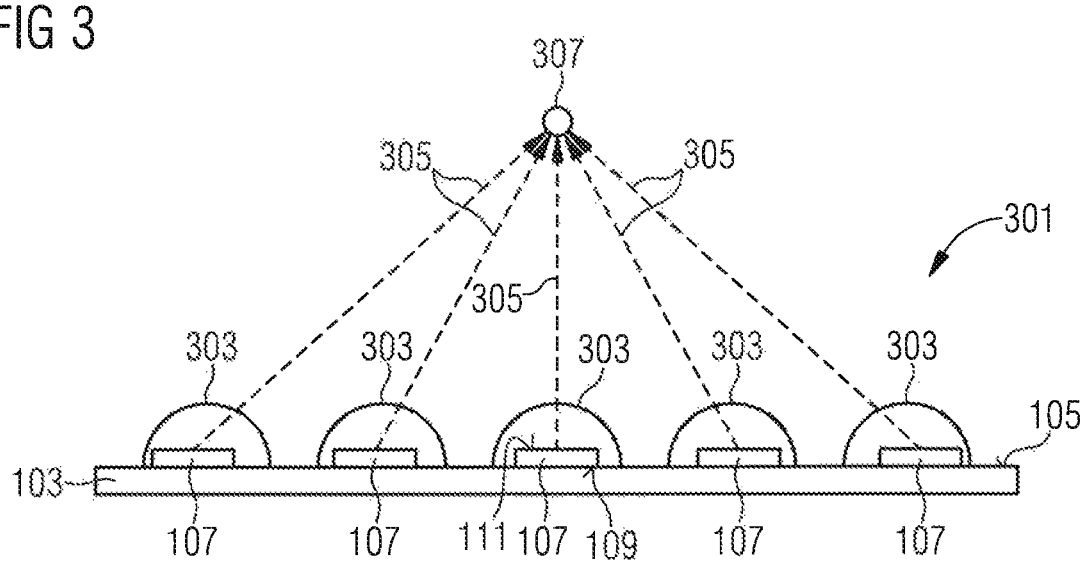
FIG. 3 shows a third optoelectronic lighting device.

FIG. 3 shows a third optoelectronic lighting device 301 in a lateral sectional view.

The lighting device 301 comprises a carrier 103 and a plurality of semiconductor components 107. The semiconductor components 107 are arranged alongside one another on the top side 105 of the carrier 103. Although not shown explicitly in FIG. 3, provision is made, for example, for the plurality of semiconductor components 107 to electrically connect to the top side 105 of the carrier 103 by a bond wire 113 analogously to the lighting devices 101, 201 shown in FIGS. 1 and 2. By way of example, the semiconductor components 107 may be configured such that they are contacted from their underside 109. A semiconductor component so configured may be referred to as a flip-chip. Alternatively to the flip-chip, the semiconductor components 107 each comprise a planar electrical contact pad, for example, at their top side 111. The contact pad is configured, for example, as a photolithographic contact pad.

A respective lens 303 is formed or arranged on each of the semiconductor components 107, which lens may image light emitted by the semiconductor components 107 during operation. The lenses 303, too, have been formed in accordance with my method of forming one or more three-dimensional objects.

In this case, the plurality of lenses 303 are formed such that they image the respective emitted light at a common focal point 307. This is shown symbolically by light beams 305 emanating in each case from the semiconductor components 107 and pointing at the common focal point 307.

That is to say, therefore, that my method efficiently enables each of the lenses 303 to be provided with an individual image characteristic so that they image the light into a common focal point 307.

Figure 4:
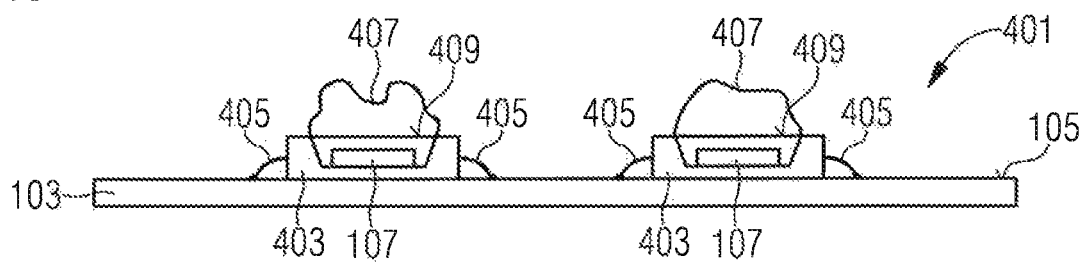
FIG. 4 shows a fourth optoelectronic lighting device.

FIG. 4 shows a fourth optoelectronic lighting device 401 in a lateral sectional view.

The optoelectronic lighting device 401 comprises a carrier 103, configured here as a circuit board. Two semiconductor components 107 are arranged on the top side 105 of the carrier 103. In this case, the two semiconductor components 107 are arranged in a housing 403, which was formed by a potting process. That is to say that the two semiconductor components 107 are each situated in a potting housing. The semiconductor components 107 electrically contact with or connect to the top side 105 of the carrier 103 via bond wires 405.

A freeform lens 407 is arranged on a top side 409 of the respective housing 403 by my method of forming one or more three-dimensional objects. The shape or geometry of the freeform lenses 407 may advantageously be configured with a variety of variants and flexibly. Consequently, the two semiconductor components 107 each obtain individual imaging optical units. Particular optical impressions may thereby be achieved, for example, in an advantageous manner.

The two lenses 407 may be formed on the top sides 409 before the electrical contacting of the two semiconductor components 107 with the top side 105 of the carrier 103. The electrical contacting may be carried out first, and then the process of forming the two freeform lenses 407.

Figure 5:
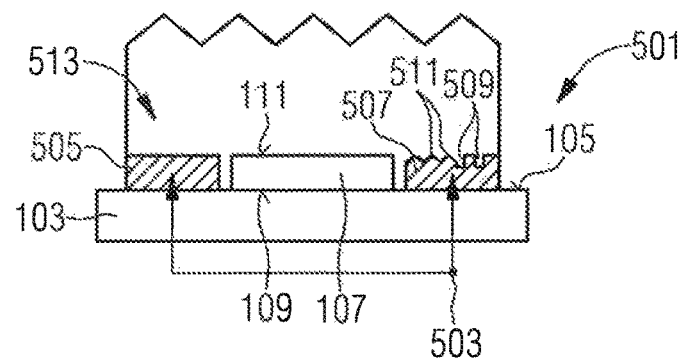
FIG. 5 shows a fifth optoelectronic lighting device.

FIG. 5 shows a fifth optoelectronic lighting device 501 in a lateral sectional view.

The optoelectronic lighting device 501 comprises a carrier 103, wherein an optoelectronic semiconductor component 107 is arranged on the top side 105 of the carrier 103. Furthermore, an anchoring structure 503 is arranged on the top side 105 of the carrier 103. The anchoring structure 503 comprises a component comprising two component sections 505, 507. The component comprising the two component sections 505, 507 is arranged on the top side 105 of the carrier 103 and extends circumferentially around or encloses the semiconductor component 107 and is configured such that an anchoring structure is formed by the component sections 505, 507.

By way of example, the component section 507 comprises depressions 509 and elevations in the form of tips 511. That is to say that the component section 507 comprises a surface structure or a surface relief. That is to say that the top side of the component section 507 is not planar.

The component section 505 comprises an adhesion promoter layer, not illustrated in detail here and to which the solid polymer may adhere well and efficiently during curing. By this means, too, an anchoring of the solid polymer is brought about.

An efficient anchoring of the solid polymer is likewise brought about on account of the surface structure or the relief structure of the component section 507.

The solid polymer is provided with the reference sign 513 in FIG. 5 and thus forms a three-dimensional object which is formed or arranged on the carrier 103 and is anchored at the anchoring structure 503.

The two component sections 505, 507 are configured, for example, such that they comprise a height corresponding to a height of the semiconductor component 107 relative to the top side 105. A height equalization is thus brought about as a result. The two component sections 505, 507 furthermore form a frame for the semiconductor component 107.

Figure 6:
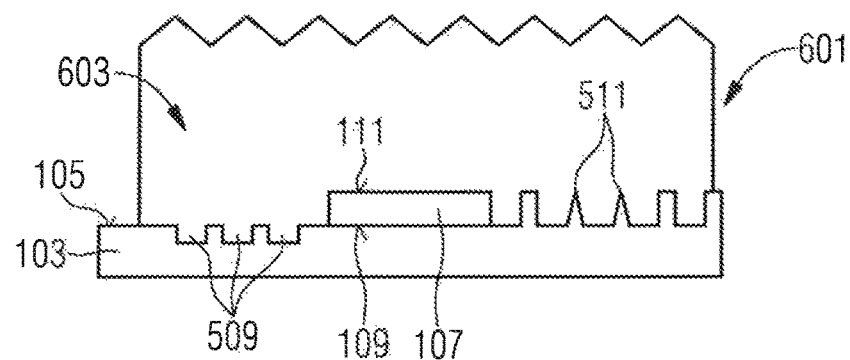
FIG. 6 shows a sixth optoelectronic lighting device.

FIG. 6 shows a sixth optoelectronic lighting device 601 in a lateral sectional view.

The lighting device 601 comprises a carrier 103, on which a semiconductor component 107 is arranged. The top side 105 of the carrier 103 is provided with a relief or a three-dimensional surface structure comprising, for example, depressions 509 and elevations in the form of tips 511. The three-dimensional surface structure forms an anchoring structure, at which a three-dimensional object 603 produced in accordance with my method of forming one or more three-dimensional objects is anchored.

The anchoring structure of the lighting device 601 in FIG. 6 is formed integrally with the carrier 103.

Figure 7:
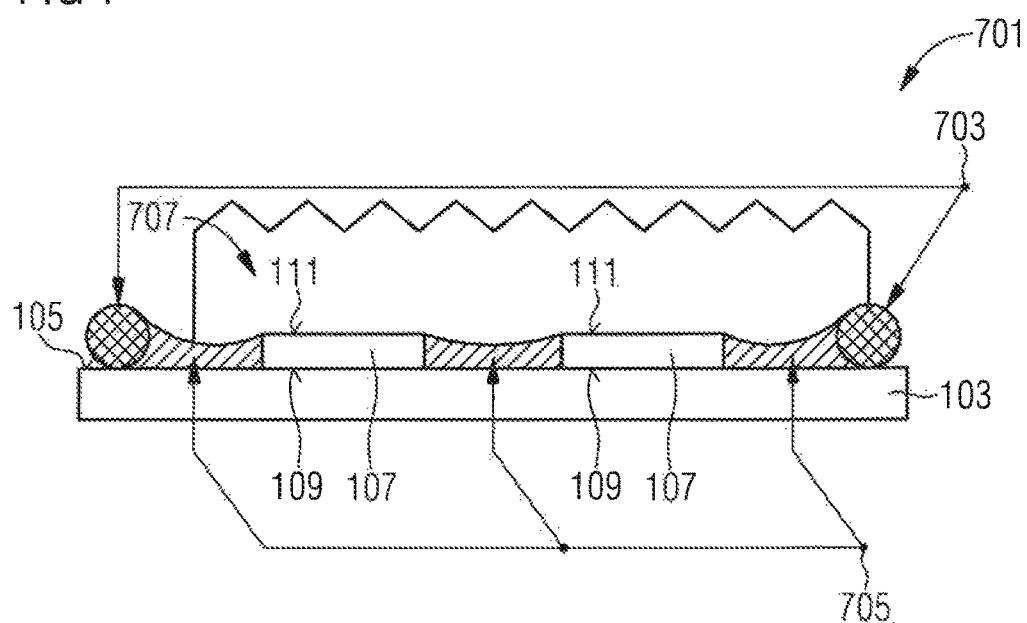
FIG. 7 shows a seventh optoelectronic lighting device.

FIG. 7 shows a seventh optoelectronic lighting device 701 in a lateral sectional view.

The lighting device 701 comprises a carrier 103, on which two semiconductor components 107 are arranged. Extending circumferentially around the two semiconductor components 107, a dam 703 is formed or arranged on the top side 105 of the carrier 103. The dam 703 is formed from silicone, for example.

The dam 703 prevents a potting material 705 coated or applied on the top side 105 of the carrier 103 between the two dams 703 and between the semiconductor components 107 from running down from the carrier 103.

The optoelectronic lighting device 701 furthermore comprises a three-dimensionally formed object 707, which was formed or produced by my method of forming one or more three-dimensional objects. The object 707 is arranged on the two top sides 111 of the semiconductor components 107 and also on the potting material 705 itself. By way of example, the potting material 705 may be provided or coated with an adhesion promoting layer such that an efficient adhesion of the object 707 to the potting material 705 may be brought about.

The potting material 705 comprises titanium dioxide (TiO2), for example.

Figure 8:
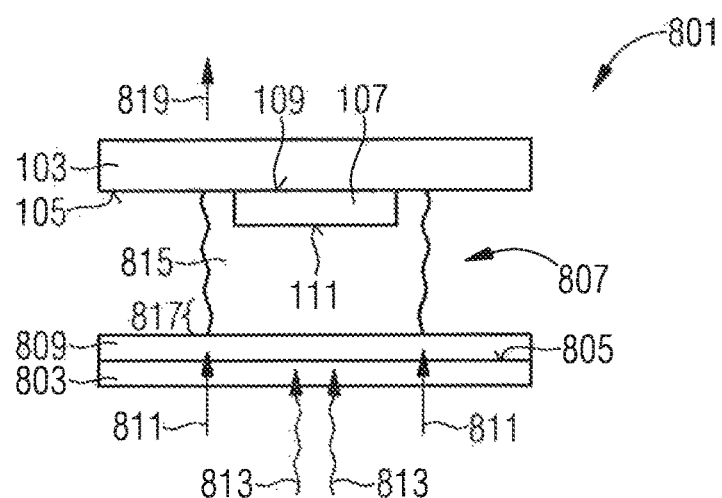
FIG. 8 shows an eighth optoelectronic lighting device during a process of forming a three-dimensional object.

FIG. 8 shows an eighth optoelectronic lighting device 801 in a lateral sectional view during a process of forming a three-dimensional object 815 in accordance with my method.

The lighting device 801 comprises a carrier 103, wherein the semiconductor component 107 is arranged on the top side 105 of the carrier 103.

Furthermore, an optically transparent element 803 is provided, which is optically transmissive to an exposure light. The element 803 comprises a construction surface 805. The top side 105 of the carrier 103 faces the construction surface 805. That is to say that the top side 111 of the semiconductor component 107 also faces the construction surface 805 of the element 803.

A construction region 807 is defined between the top side 105 and the construction surface 805, the construction region thus being situated between the carrier 103 and the construction surface 805.

A polymerizable liquid is introduced into the construction region 807. That is to say that the construction region 807 is filled with a polymerizable liquid.

To form one or more solid polymers from the polymerizable liquid, and to form one or more three-dimensional objects from the one or more solid polymers, provision is made for the construction region 807 to be exposed through the optically transparent element 803, for example, by UV light. Exposure is identified symbolically by two arrows depicted in a wavy manner and bearing the reference sign 813.

In the concrete example in FIG. 8, one three-dimensional object 815 is formed such that one solid polymer is formed by the exposure of the construction region 807, the object 815 then being formed from the solid polymer.

During exposure, the carrier 103 is moved away from the construction surface 805. This is identified symbolically by an arrow 819 intended to symbolically represent this forward movement.

So that polymerizable liquid may always continue flowing on account of the forward movement 819 of the carrier 103, provision is made for an ineffective region 809 to be formed directly on the construction surface 805 during exposure and during the forward movement 819. In this case, during exposure and during the forward movement 819, provision is made for the ineffective region 809 always to remain in contact with the construction surface 805. That is to say that a contact between the ineffective region 809 of the polymerizable liquid and the construction surface 805 is continuously maintained.

The ineffective region 809 is formed, for example, by a polymerization inhibitor, for example, oxygen diffusing through the optically transparent element 803 into the construction region 807. That is to say that, for example, the element 803 is configured as permeable to such a polymerization inhibitor. By way of example, the element 803 is permeable to oxygen. The process in which oxygen, generally a polymerization inhibitor, passes through or diffuses through is identified symbolically by two arrows bearing the reference signs 811.

As a result of the inhibitor being provided, the ineffective region 809 thus forms, in which polymerization is inhibited. A region in which the polymerization comprises a gradient is formed after the ineffective region 809. That is to say that a degree of polymerization of the liquid increases in the region, the further from the ineffective region 809 the liquid is situated. The region in which such a polymerization gradient is present is identified symbolically by a curly bracket bearing the reference sign 817.

Thus, the curing or polymerizing of the liquid then takes place in the region 817 such that ultimately the three-dimensional object 815 forms. The region 817 thus forms a curing zone.

On account of continuously maintaining the contact between the ineffective region 809 of the polymerizable liquid, in which polymerization is inhibited, and the construction surface 805, what is thus advantageously achieved or brought about is that the polymerizable liquid continues flowing. As a result, the object 815 may advantageously be formed continuously, that is to say during the forward movement 819. This is in contrast to known 3D printing methods that do not provide such an ineffective region, and so a continuous forward movement is not possible, which reduces a printing speed.

Figure 9:
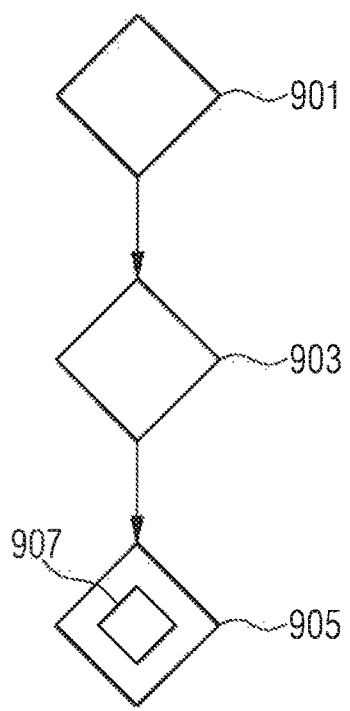
FIG. 9 shows a flow diagram of a method of forming one or more three-dimensional objects.

FIG. 9 shows a flow diagram of a method of forming one or more three-dimensional objects for an optoelectronic lighting device comprising a carrier with an optoelectronic semiconductor component.

The method comprises the following steps:
providing 901 an optically transparent element comprising a construction surface and a carrier of an optoelectronic lighting device, wherein an optoelectronic semiconductor component facing the construction surface is arranged on the carrier, wherein the carrier and the construction surface define a construction region lying between them, filling 903 the construction region with a polymerizable liquid, exposing 905 the construction region through the optically transparent element with simultaneous forward movement of the carrier away from the construction surface to form one or more solid polymers from the polymerizable liquid, and form one or more three-dimensional objects from the one or more solid polymers, with the following step simultaneously being performed:

continuously maintaining 907 a contact between an ineffective region of the polymerizable liquid, in which polymerization is inhibited, and the construction surface.

Figure 10:
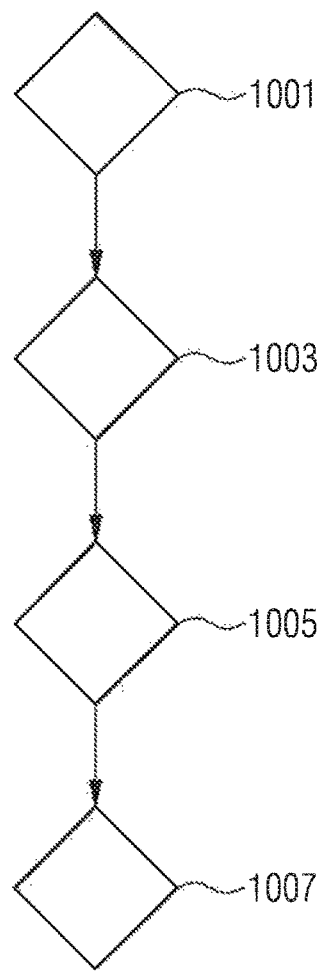
FIG. 10 shows a flow diagram of a further method of forming one or more three-dimensional objects.

FIG. 10 shows a flow diagram of a further method of forming one or more three-dimensional objects for an optoelectronic lighting device comprising a carrier with an optoelectronic semiconductor component.

The method comprises the following steps:

providing 1001 a carrier of an optoelectronic lighting device, wherein an optoelectronic semiconductor component is arranged on the carrier, wherein a construction region partly delimited by the carrier is defined, the optoelectronic semiconductor component facing the construction region, introducing 1003 a polymerizable liquid into the construction region, exposing 1005 the construction region to form one or more solid polymers from the polymerizable liquid in a curing zone comprised by the construction region, and form one or more three-dimensional objects from the one or more solid polymers in the curing zone, wherein an ineffective region is formed 1007 during the process of exposing 1005 the construction region, polymerization being inhibited in the ineffective region, wherein the curing zone is arranged between the carrier and the ineffective region.

An optical waveguide may be formed as a three-dimensional object, in particular an optical waveguide for a motor vehicle rear light.

An optical waveguide may be formed as a three-dimensional object, in particular an optical waveguide to distribute light in an LED retrofit. An LED retrofit denotes, in particular, a lamp which, in terms of shape and function, is modeled on a conventional lamp, for example, an incandescent bulb.

An optical waveguide may be formed as a three-dimensional object, in particular an optical waveguide to distribute light in an LED retrofit, wherein the light is guided and coupled out from the optical waveguide such that during operation an optical impression like that of an incandescent thread or an incandescent filament of a conventional incandescent bulb arises for an observer.

Therefore, the optical waveguide may be configured, for example, such that light guiding and/or light coupling-out bring(s) about an optical impression of an incandescent thread or an incandescent filament.

The optical waveguide may comprise a hollow cylinder.

The optical waveguide may comprise a plurality of optical waveguide branching junctions. The optical waveguide thus branches.

A first longitudinal end of the hollow cylinder may be arranged on the semiconductor component and a plurality of optical waveguide branching junctions may be formed at the opposite longitudinal end of the hollow cylinder relative to the first longitudinal end.

My basic concept should be seen, in particular, in applying, for example, light emitting diode chips or light emitting diode packages on a carrier, which may also be referred to as a carrier board. The board is, for example, a ceramic board, a metal-core printed circuit board or a circuit board ("Printed Circuit Board"). The circuit board is rigid, for example, or flexible, for example. The board with the applied LED ("Light emitting diode") chip or with the applied LED chips or with the applied LED package is then immersed in the polymerizable liquid and my method, as described above, is carried out.

Prior to immersion, a convertor may be applied in the form of a lamina or by electrophoresis or by spray coating on the LED chips or the LED package.

A planar-potted component may be used instead of the carrier, and for growing or printing a freeform lens and/or optical waveguide on the planar-potted component.

My 3D printing method advantageously enables shapes of packages and optical waveguides which, in injection molding or other conventional methods, would not be possible or would be possible only by assembling a plurality of parts. The flexibility of the 3D printing method advantageously also allows efficient production of small batches or products comprising many variants. Especially when forming an optical waveguide, it is possible to integrate the light emitting diodes directly into the optical waveguide.

The three-dimensional objects formed are advantageously able directly to be used or to be processed further without the adhesive bonding steps otherwise required.

Singulating may be provided. That is to say that the carrier comprising a plurality of semiconductor components may be singulated after the process of forming the three-dimensional objects. A three-dimensionally formed object is, for example, a component side wall, for example, a housing side wall of a housing for the semiconductor component.

Consequently, in particular component side walls, for example, by a white 3D printing compound, and/or optical waveguides are shaped. If the component side walls are formed by my 3D printing method, then shapes that are not able to be produced by injection molding may advantageously be produced. By way of example, housing side walls comprise undercuts or are formed as hollow bodies comprising openings.

This is advantageous particularly if infrared transmitting and receiving diodes are arranged on the carrier, where good shading or shielding of the transmitting diode from the receiving diode is of importance, but the external reflection signal is intended to be relayed well. That is to say that, an infrared transmitting diode and an infrared receiving diode may be arranged on the carrier, which diodes are shielded from one another with correspondingly formed housing side walls.

A use of a three-dimensional object as a shutter edge in motor vehicle front lights is also provided.

The three-dimensional object formed may be an optical waveguide. Optical waveguides formed in such a way may thus advantageously be produced virtually in freeform in an efficient manner on the basis of the carrier, which may also be referred to as a substrate, with the LED chips.

The three-dimensional object formed may be a freeform lens. By my 3D printing method, freeform lenses may advantageously be printed directly onto components or carrier boards populated with LED chips. This comprises in particular the advantage of easy adaptability and a high variety of variants. By way of example, provision is made for providing in this way an array comprising LED semiconductor components each comprising an individual lens shape, wherein each lens comprises an individually adapted emission direction, thus resulting in an adapted emission profile. By way of example, the plurality of lenses may be configured such that they image the light at a common focal point in the far field. One advantage over conventionally manufactured lenses consists, in particular, of the fact that many individually adapted lenses may be produced rapidly without complex production of individual molds (potting molds).

Depressions (and/or holes) and/or elevations may be provided on the carrier for the purpose of anchoring, which are either filled or enclosed by the polymerizable liquid. This advantageously brings about a good and stable anchoring of the three-dimensionally printed structures (three-dimensionally formed object) on the carrier.

Under certain circumstances, owing to the dictates of the method, it may be difficult to grow the three-dimensional objects at the base, that is to say on the top side of the carrier, alongside particularly high chip structures. This is so particularly if the structures (for example, chips comprising bond wires) are higher than the thickness of the ineffective region. Therefore, provision is made, for example, to provide thin chips (semiconductor chips comprising a maximum thickness of 100 µm). By way of example, instead of an electrical contacting by bond wires, a lithographic structure is used for electrical contacting. By way of example, flip-chips without top-side contacts are used. By way of example, the chips are placed in depressions formed on the carrier, for example, through a structured intermediate layer.

An intermediate layer structured in such a way and which is applied or formed on the top side of the carrier alongside the semiconductor components also acts, for example, as an adhesion promoter layer for an optical waveguide.

The adhesion promoter layer comprises a silicone coating, for example.

The structured intermediate layer is embodied or formed, for example, as a highly reflectively filled, cured potting (for example, titanium dioxide potting). This is the case, for example, in the so-called "dam-and-fill method". This method comprises forming a dam for the potting material on the top side of the carrier, the dam then preventing the potting material from flowing down from the carrier during the process of applying the potting material on the top side.

Particularly for optical waveguide solutions in blue or white LEDs, provision is made for operating the semiconductor components (LEDs) during and/or before exposure, to achieve a particularly good adhesion of 3D optical waveguides around the LEDs, since a UV portion of the light emitted by the blue LED cures the polymerizable liquid such that a better positively locking engagement (adhesion) of the object on the LED may be achieved.

That is to say that, in accordance with my concept, provision is made for the semiconductor component to be operated before and/or during exposure such that the semiconductor component emits blue or white light, which then leads to polymerization of the polymerizable liquid in the direct vicinity of the semiconductor component, which then in turn leads to better adhesion or to a better positively locking engagement.

In general, for an LED a highly reflective coating of the surface of the carrier or a carrier material comprising good reflectivity is important to achieve a good luminous efficiency. This may possibly lead, under certain circumstances, to undesired reflections of the exposure light, for example, of the UV light. Therefore, provision may be made for the top side of the carrier to comprise a coating that absorbs at least 90% of UV light. By way of example, the carrier material of the carrier may absorb at least 90% of UV light. As a result, undesired stray light and thus a falsification of the desired shape of the three-dimensional object may thus advantageously be avoided.

By my method, optical waveguide solutions for so-called "retrofits" may advantageously be produced in a particularly simple manner. A "retrofit" denotes a shape that was in fashion in the past or was customary in the past. In the case of such a retrofit, provision is then made, for example, for the LED to disappear in a base, but for the optical waveguide to project into the upper space of the, for example, bulb-type retrofit, to give the optical impression of an incandescent filament. Here, too, the three-dimensional printing method such as was described above affords the advantage of a free design for such optical waveguides which are intended to give the impression of an incandescent filament.

Although my methods and devices have been more specifically illustrated and described in detail by preferred examples, nevertheless this disclosure is not restricted by the examples disclosed and other variations may be derived therefrom by those skilled in the art without departing from the scope of protection of the appended claims.

This application claims priority of DE 10 2015 115 796.9, the subject matter of which is incorporated herein by reference.

The invention claimed is:

1. A method of forming one or more three-dimensional objects for an optoelectronic lighting device comprising a carrier with an optoelectronic semiconductor component, comprising:

providing a carrier of an optoelectronic lighting device, wherein an optoelectronic semiconductor component is arranged on the carrier, and a construction region partly delimited by the carrier is defined, the optoelectronic semiconductor component facing said construction region, introducing a polymerizable liquid into the construction region, and exposing the construction region to form one or more solid polymers from the polymerizable liquid in a curing zone comprised by the construction region, and one or more three-dimensional objects from said one or more solid polymers in the curing zone, wherein an ineffective region is formed during the process of exposing the construction region, polymerization being inhibited in said ineffective region, and the curing zone is arranged between the carrier and the ineffective region.

2. The method according to claim 1, wherein said one or more three-dimensional objects are each an element selected from a group of three-dimensional objects: housing wall for a housing for the semiconductor component, optical waveguide for guiding light emitted by the semiconductor component away from the semiconductor component, and lens for optically imaging light emitted by the semiconductor component.

3. The method according to claim 2, wherein, in a housing wall, the housing wall is formed such that the housing wall projects beyond a semiconductor component surface of the semiconductor component that faces away from the carrier to at least partly shield the semiconductor component surface from electromagnetic radiation.

4. The method according to claim 2, wherein, in an optical waveguide, the optical waveguide is formed on a light emitting surface of the semiconductor component.

5. The method according to claim 2, wherein, in a lens, the lens is formed on a light emitting surface of the semiconductor component.

6. The method according to claim 1, further comprising:
providing an optically transparent element comprising a construction surface, wherein the optoelectronic semiconductor component faces the construction surface, the construction region is defined by the carrier and the construction surface as the region lying between the carrier and the construction surface,
filling the construction region with the polymerizable liquid,
exposing the construction region through the optically transparent element with simultaneous forward movement of the carrier away from the construction surface to form one or more solid polymers from the polymerizable liquid in the curing zone, and one or more three-dimensional objects from said one or more solid polymers in the curing zone, with a step of simultaneously performing:
continuously maintaining a contact between the ineffective region of the polymerizable liquid and the construction surface.

7. The method according to claim 1, wherein, after the process of introducing the polymerizable liquid into the construction region and before and/or during the process of exposing by the semiconductor component, ultraviolet light is emitted to polymerize the polymerizable liquid.

8. The method according to claim 1, wherein the carrier comprises a coating configured to absorb at least 50% of a wavelength of the exposure light.

9. An optoelectronic lighting device comprising:
a carrier on which an optoelectronic semiconductor component is arranged, and
one or more three-dimensional objects each formed by the method according to claim 1.

10. The method according to claim 1, wherein the top side of the carrier is provided with a relief or a three-dimensional surface structure, wherein the three-dimensional surface structure forms an anchoring structure, at which the one or more three-dimensional objects is or are anchored.

11. A method of forming one or more three-dimensional objects for an optoelectronic lighting device comprising a carrier with an optoelectronic semiconductor component, comprising:
providing a carrier of an optoelectronic lighting device, wherein an optoelectronic semiconductor component is arranged on the carrier, and a construction region partly delimited by the carrier is defined, the optoelectronic semiconductor component facing said construction region, wherein the carrier comprises an anchoring structure,
introducing a polymerizable liquid into the construction region, and
exposing the construction region to form one or more solid polymers from the polymerizable liquid in a curing zone comprised by the construction region, and one or more three-dimensional objects from said one or more solid polymers in the curing zone,
wherein an ineffective region is formed during the process of exposing the construction region, polymerization being inhibited in said ineffective region, and the curing zone is arranged between the carrier and the ineffective region, wherein the anchoring structure anchors said one or more solid polymers on the carrier.

12. The method according to claim 11, wherein the anchoring structure is formed at least partly integrally with the carrier, and/or wherein the anchoring structure is formed at least partly as a component physically separate from the carrier and is arranged thereon.

13. An optoelectronic lighting device comprising:
a carrier on which an optoelectronic semiconductor component is arranged, and
one or more three-dimensional objects each formed by the method according to claim 11.

14. The method according to claim 11, wherein the anchoring structure is arranged on the top side of the carrier, wherein the anchoring structure comprises a component comprising two component sections, wherein the component comprising the two component sections is arranged on the top side of the carrier and extends circumferentially around or encloses the semiconductor component and is configured such that an anchoring structure is formed by the component sections.

15. The method according to claim 11, wherein the anchoring structure is arranged on the top side of the carrier, wherein the anchoring structure comprises a component comprising at least one component section, wherein the component section comprises depressions and elevations in the form of tips.

16. A method of forming one or more three-dimensional objects for an optoelectronic lighting device comprising a carrier with an optoelectronic semiconductor component, comprising:
providing a carrier of an optoelectronic lighting device, wherein an optoelectronic semiconductor component is arranged on the carrier, and a construction region partly delimited by the carrier is defined, the optoelectronic semiconductor component facing said construction region, wherein the carrier comprises an adhesion promoter layer,
introducing a polymerizable liquid into the construction region, and
exposing the construction region to form one or more solid polymers from the polymerizable liquid in a curing zone comprised by the construction region, and one or more three-dimensional objects from said one or more solid polymers in the curing zone,
wherein an ineffective region is formed during the process of exposing the construction region, polymerization being inhibited in said ineffective region, and the curing zone is arranged between the carrier and the ineffective region, wherein the adhesion promoter layer adheres said one more solid polymers to the carrier.

17. An optoelectronic lighting device comprising:
a carrier on which an optoelectronic semiconductor component is arranged, and one or more three-dimensional objects each formed by the method according to claim 16.

* * * * *